United States Patent
Rategh et al.

(10) Patent No.: US 7,009,454 B2
(45) Date of Patent: Mar. 7, 2006

(54) METHOD AND APPARATUS FOR OPTIMIZATION OF AMPLIFIER WITH ADJUSTABLE OUTPUT RANGE

(75) Inventors: Hamid Reza Rategh, Cupertino, CA (US); Mehdi Frederik Soltan, Santa Clara, CA (US)

(73) Assignee: Anadigics Inc., Warren, NJ (US)

( * ) Notice: Subject to any disclaimer, the term of this patent is extended or adjusted under 35 U.S.C. 154(b) by 127 days.

(21) Appl. No.: 10/760,698

(22) Filed: Jan. 20, 2004

(65) Prior Publication Data

US 2005/0156670 A1    Jul. 21, 2005

(51) Int. Cl.
*H03F 3/68* (2006.01)
(52) U.S. Cl. .................. 330/295; 330/285; 330/296
(58) Field of Classification Search ............ 330/295, 330/277, 302, 124 R, 306, 296, 286, 303, 330/285, 297
See application file for complete search history.

(56) References Cited

U.S. PATENT DOCUMENTS

| 6,252,461 | B1 * | 6/2001 | Raab ..................... 330/302 |
| 6,538,515 | B1 * | 3/2003 | Brandt .................. 330/285 |
| 6,552,634 | B1 * | 4/2003 | Raab ..................... 333/216 |
| 2002/0097096 | A1 * | 7/2002 | Brandt .................. 330/295 |
| 2003/0179048 | A1 * | 9/2003 | Kolsrud et al. ......... 330/296 |

* cited by examiner

*Primary Examiner*—Jean Jeanglaude
*Assistant Examiner*—John B Nguyen
(74) *Attorney, Agent, or Firm*—H. Black P.E.

(57) ABSTRACT

A method and apparatus for an amplifier, such as a radio frequency amplifier embodied as an integrated circuit is disclosed. Embodiments provide for a wide range of operating powers with good energy efficiency at many power levels. Resonant components act to provide consistent operating parameters over the wide range of power levels used. The invention may operate in the microwave region or at other RFs.

2 Claims, 8 Drawing Sheets

METHOD AND APPARATUS FOR OPTIMIZATION OF AMPLIFIER WITH ADJUSTABLE OUTPUT RANGE

FIELD OF THE INVENTION

The invention generally relates to electronics circuits. The invention more particularly relates to amplifier circuits, for example, RF (radio frequency) PA (power amplifier) circuits especially integrated circuits for microwave signals that are used to provide gain of an input signal.

BACKGROUND OF THE INVENTION

RF power amplifiers of conventional design typically suffer from a significant efficiency reduction when the output power level is adjusted to values below the peak design output power by varying the input drive to the power amplifier. This is true for all classes of amplifiers: A, B, C, E, and F. Maintaining efficiency with RF output power cutback is an important requirement for radios that are designed to save battery power as a result of reduced power operation. Generally speaking, the power efficiency of power amplifiers operated at small signal levels will be poor unless the amplifier incorporates features expressly to remedy that incipient deficiency.

One known option for varying output power while maintaining efficiency is to adjust the voltage supply to the amplifier stage. However, this option is inconvenient since a high efficiency DC/DC (direct current) converter is required in the case of a battery powered RF amplifier.

Another option is to use one or more variations on the well-known Doherty Amplifier which comprises a carrier amplifier and a peaking amplifier. This option is relatively expensive when embodied as an integrated circuit due to the types of circuit required.

A further option is described in U.S. Pat. No. 5,276,912 issued to Siwiak et al., wherein a multi-mode transformation network is used to vary an impedance presented at an output transistor as a means to vary power level. Typically such implementations suffer from lossy components such as PIN diodes in the multi-mode transformation network. Also, the output impedance at the output transistor is not at the optimal value for the power level when operated in the lower power mode. Moreover, all impedance mismatches have negative implications for voltage levels arising out of reflections thus giving rise to consequent reliability and longevity issues especially where the amplifier is implemented as an integrated circuit such as an analog CMOS (complementary metal-oxide semiconductor) circuit.

Thus there is a need for an improved amplifier design capable of multiple power levels and a superior tradeoff between power efficiency and cost.

SUMMARY

Accordingly, the invention provides amplifiers with superior performance and power efficiency. Such an amplifier may be implemented as an IC (integrated circuit) with CMOS or other semiconductor technologies such as GaAs (Gallium Arsenide) or InP (Indium Phosphate) or other III–IV semiconductor devices. High operating frequency (e.g., microwave) may be supported through LSI (large scale integration), as is well-known in the art. Superior performance results from aspects of the novel designs.

According to a first aspect of the invention, a method for amplifying is disclosed, the method comprising operating first and second amplifiers with respective matching networks and having outputs summed together. In one operating mode both amplifiers are biased to be active and in a lower power operating mode one of the amplifiers is at least partially cut off. Due to the circuit configuration and the arrangement exploiting resonances at the operating frequency efficiency is preserved even when power is reduced as in the lower power operating mode.

According to another aspect of the invention, an embodied circuit is disclosed which may exploit the method of the first aspect.

Several variants of these aspects are also disclosed together with alternative exemplary embodiments.

BRIEF DESCRIPTION OF THE DRAWINGS

The accompanying drawings, which are incorporated in and constitute a part of the specification, illustrate an embodiment of the invention, and, together with the description, serve to explain the principles of the invention.

For convenience in description, identical components have been given the same reference numbers in the various drawings.

DETAILED DESCRIPTION OF THE PREFERRED EMBODIMENTS

Figure 1:
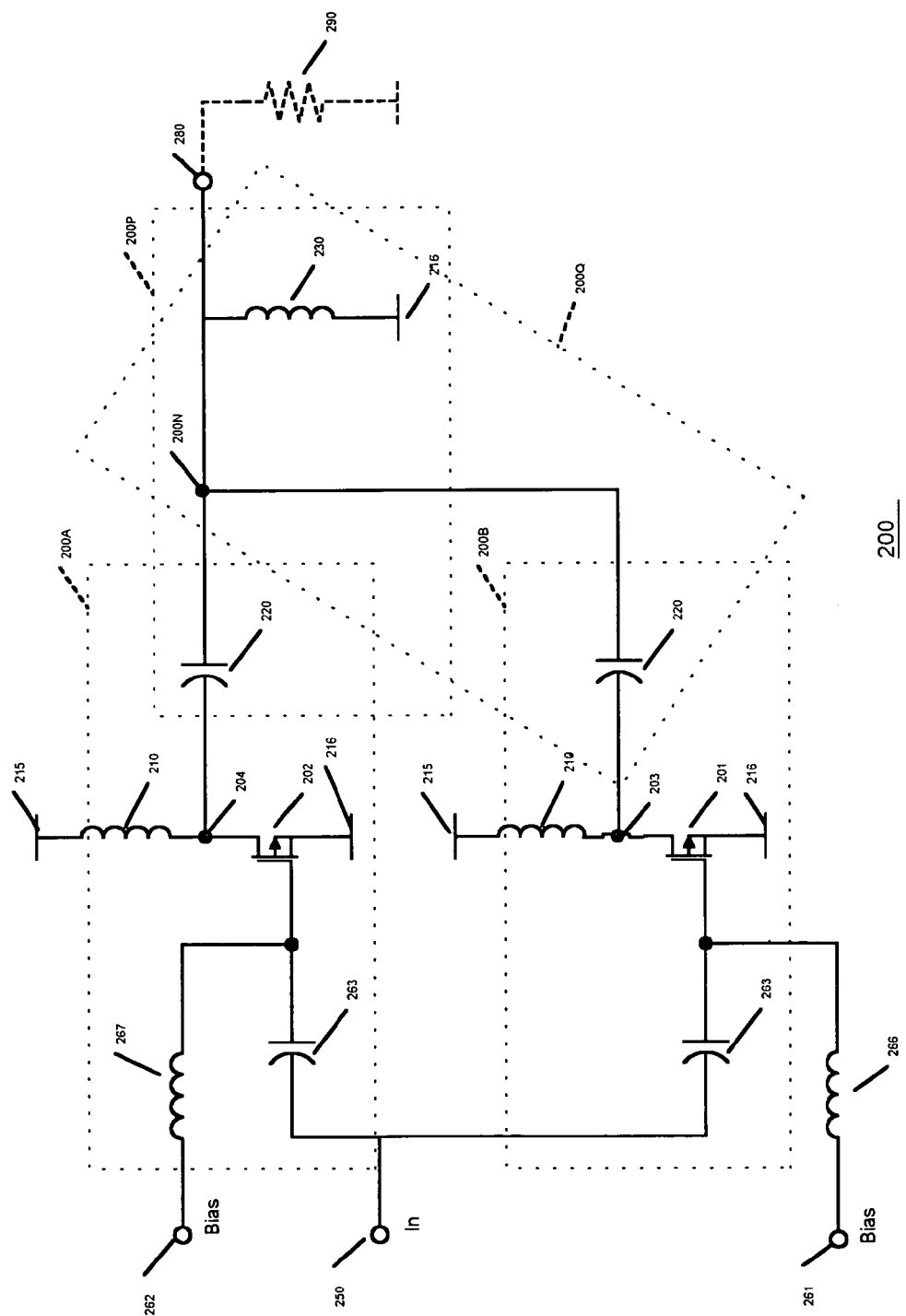
FIG. 1 shows a schematic diagram of a part of an integrated circuit according to an embodiment of the invention.

In the following description, for purposes of clarity and conciseness of the description, not all of the numerous components shown in the schematics and/or drawings are described. The numerous components are shown in the drawings to provide a person of ordinary skill in the art a thorough, enabling disclosure of the present invention. The operation of many of the components would be understood and apparent to one skilled in the art.

FIG. 1 is a schematic diagram of a part of an integrated circuit 200 (IC) according to an embodiment of the invention. As shown, IC 200 implements an analog RF PA (power amplifier) circuit. As a power amplifier, IC 200 may produce relatively high power levels such as might typically be needed in connection with a transmitter driving a radiating antenna. IC 200 may be implemented or incorporated as part of a semiconductor chip using well-known technologies such as MOS (metal-oxide semiconductors). MOS technologies are commonly used to embody RF PAs for use with signals in the microwave region. NMOS transistors (n-channel metal-oxide semiconductor field-effect transistors) are shown in the circuit but their use is exemplary only and comparable circuits may be constructed using PMOS transistors (p-channel metal-oxide semiconductor field-effect transistors), BJTs (Bipolar junction transistors, typically Silicon based) or other active solid state devices within the scope of the invention.

Major components of IC 200 may be two amplifiers 200A, 200B having outputs that are summed at a summing node 200N. In this exemplary embodiment, two subsystem impedance matching networks 200P, 200Q may also be identified.

In IC 200, NMOS transistors 201, 202 are active devices that function to amplify an input signal, typically an RF or IF (intermediate frequency) signal, presented at an input signal terminal 250. The circuit may be energized via a power supply rail 215 and a ground 216 in the usual manner.

The input signal may be coupled via DC blocking capacitors 263 to control terminals of transistors 201, 202. The DC bias of each transistor 201, 202 may be set independently by 0 Hz bias voltages introduced at Bias ports 261 and 262. Each transistor 201, 202 may have its own bias voltage independent of the other transistor. Optional inductors 266, 267 may serve as chokes to prevent stray RF voltages entering through the bias ports 261, 262.

The two transistors 201, 202 operate essentially in parallel and their outputs at their respective current terminal circuit nodes 203, 204 may be coupled by capacitors 220 to output port 280. Inductor 230 may function with capacitors 220 as a high-pass filter which may also operate to perform impedance transformation. An output load 290, such as a 50-Ohm radiating antenna, may be coupled to output port 280, but such load is typically not within IC 200.

Inductors 210 are circuit elements within IC 200 whose functions are described below in the discussion of equivalent circuits.

The IC 200 of FIG. 1 may be usefully operated in at least two modes:

In a first mode transistors 201 and 202 may be biased in an active or fully-on region.

In a second mode transistor 202 may be biased in an active or fully-on region and transistor 201 may be cut off, or vice versa.

In other possible intermediate modes, transistors 201 and/or 202 may be operated so as to be partially cut off by reducing their idle or quiescent current.

In the first mode transistors 201 and 202 act in parallel and both amplify the input signal to produce an output signal at the output signal port 280. In the second mode transistor 202 alone amplifies the input signal and circuit node 203 is effectively open circuit to RF signals and thus effectively disconnected from an active device (i.e. transistor 201). In the second mode the overall gain and the maximum output power of the RF PA is less than in the first mode. In the possible intermediate modes, the gain and the maximum output power will typically have values lying between those of the first and second modes.

Indeed if the two transistors 201 and 202 are identical and the associated components are also identical then the two transistors will contribute equally to the amplified output when the bias voltages are equal thus placing the circuit in the first mode. Thus, the two arms of the circuit are essentially equal or symmetrical when operated in the first mode.

Figure 2:
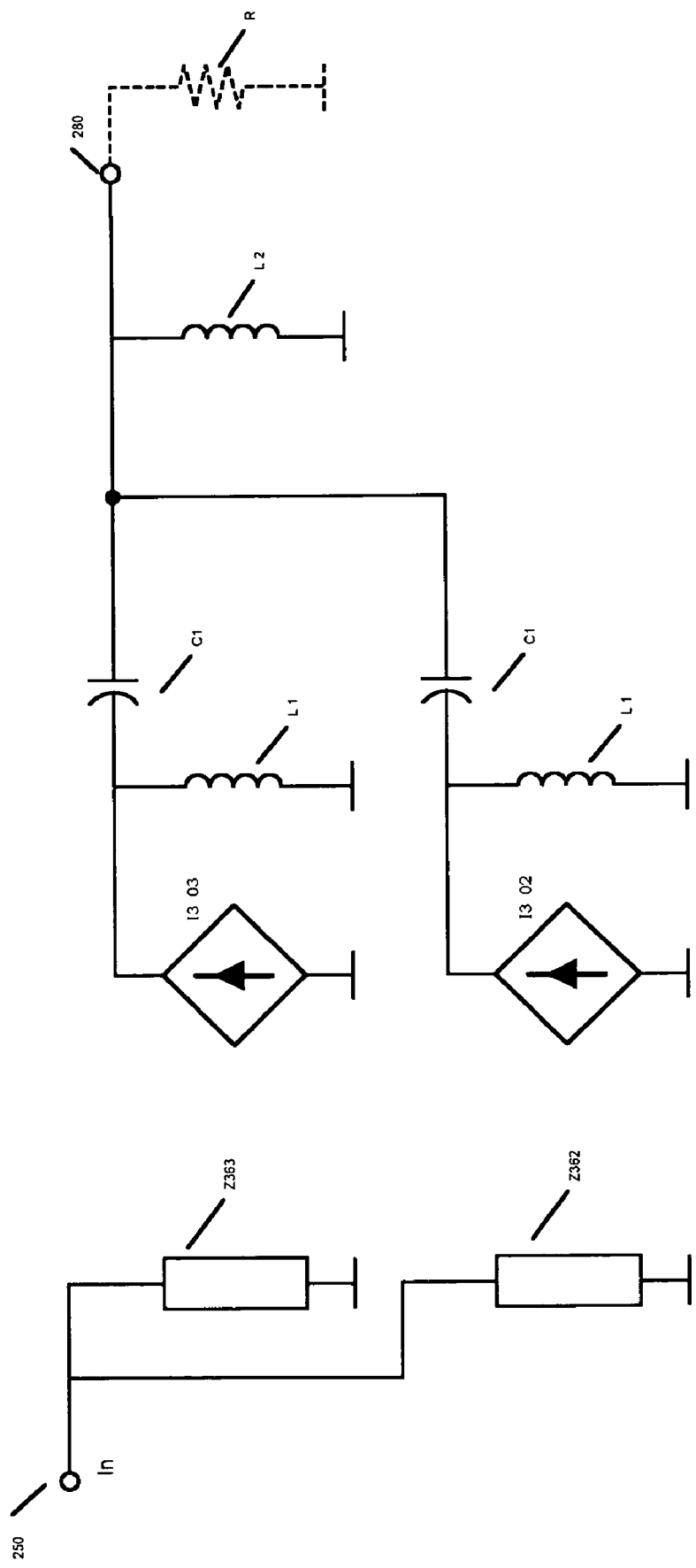
FIG. 2 depicts a small signal equivalent circuit of an RF PA embodied in FIG. 1.

FIG. 2 depicts a "Small Signal" equivalent circuit of the RF PA embodied as IC 200 in FIG. 1 operating in the first mode, i.e. when both transistors are biased into the active or fully-on region. Referring to FIG. 2 input port 250 is shown connected to equivalent input impedances Z362 and Z363. Voltage-dependent current source I302 may have a mutual transconductance $g_M$ representing the amplifying properties of corresponding transistor 201 (of FIG. 1).

Similarly, voltage-dependent current source I303 may have the same mutual transconductance $g_M$ and represent the amplifying properties of transistor 202. Inductances L1 represent the properties of inductors 210 of FIG. 1, capacitances C1 represent the properties of capacitors 220 of FIG. 1 and inductance L2 represents the property of inductor 230 FIG. 1. Output port 280 and a resistive load R are also shown.

Figure 3:
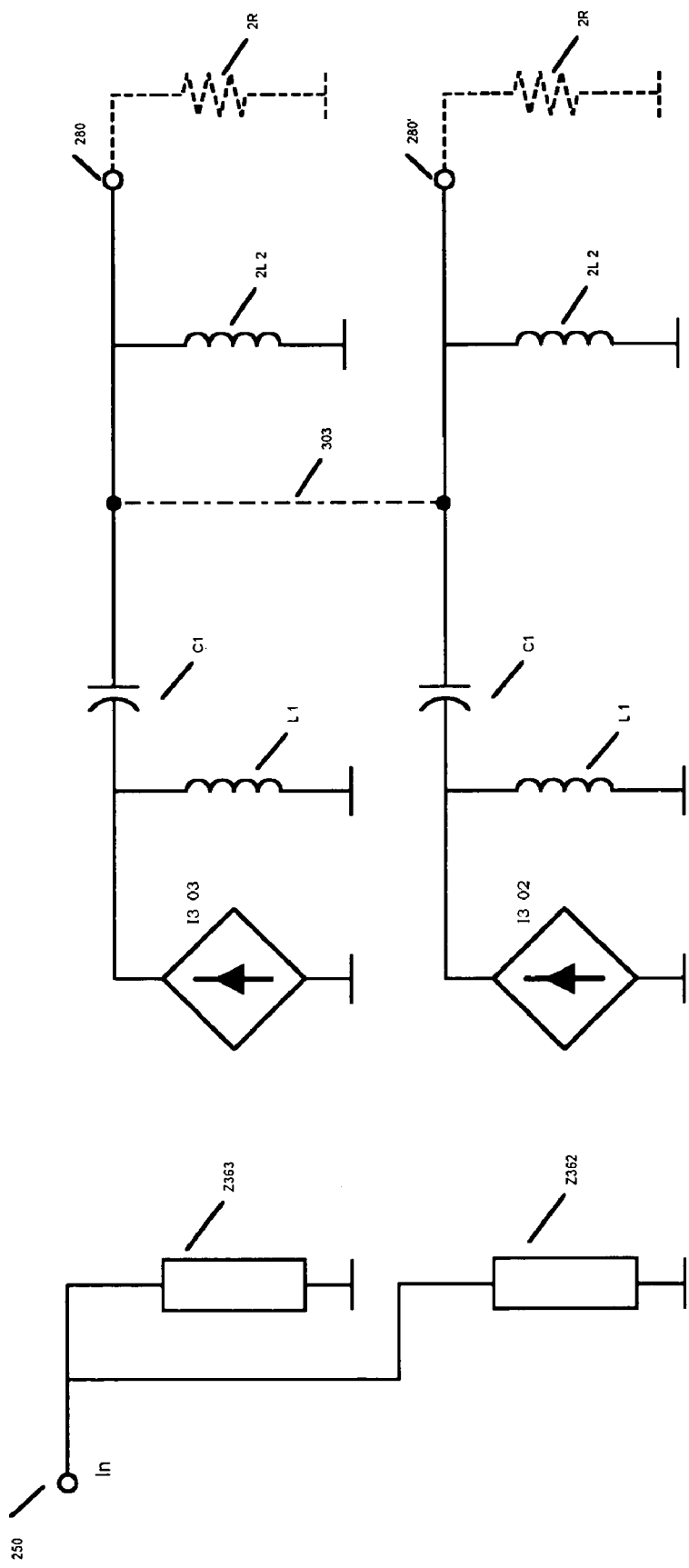
FIG. 3 depicts an alternative small signal equivalent circuit of part of the circuit of FIG. 2 operating in a first mode.

FIG. 3 depicts an alternative small signal equivalent circuit of the RF PA embodied as IC 200 in FIG. 1 operating in the first mode. That is to say FIG. 2 and FIG. 3 are equivalent in the condition that both transistors are active at the same operating point.

Contrasting FIG. 3 with FIG. 2, inductance L2 has been divided into a pair of parallel inductances 2L2, each having twice the inductance L2 as conforms to the well-known properties of inductors connected in parallel. Similarly, load resistance R is envisioned as divided into obviously equivalent pair of parallel resistances 2R2 having twice the numeric ohmic value of load R of FIG. 2 (and abbreviated to 2R herein).

Still referring to FIG. 3, by symmetry, the conductor 303 carries no current, thus it is valid to analyze each half of the circuit separately. In the normal operating condition, each pair of components C1 and 2L2 may be substantially resonant at the nominal operating (carrier) frequency of the RF PA. This resonant structure provides a suitably lower load impedance (lower than 2R that is, and of perhaps roughly three ohms in a typical embodiment) to the current source I302, I303 as appropriate. Simultaneously the resonant structure develops a suitably high voltage across inductance 2L2 in order to drive the relatively high impedance load 2R which may typically be around 100 Ohms.

In this circuit-operating mode, the inductance L1 acts to supply power while permitting small signal AC to be generated at the transistor current terminals. Provided L1 is of sufficiently large inductance to avoid excessive loading of the voltage controlled current source I303 or I302, then the actual value of L1 is not critical in the first operating mode.

Figure 4A:
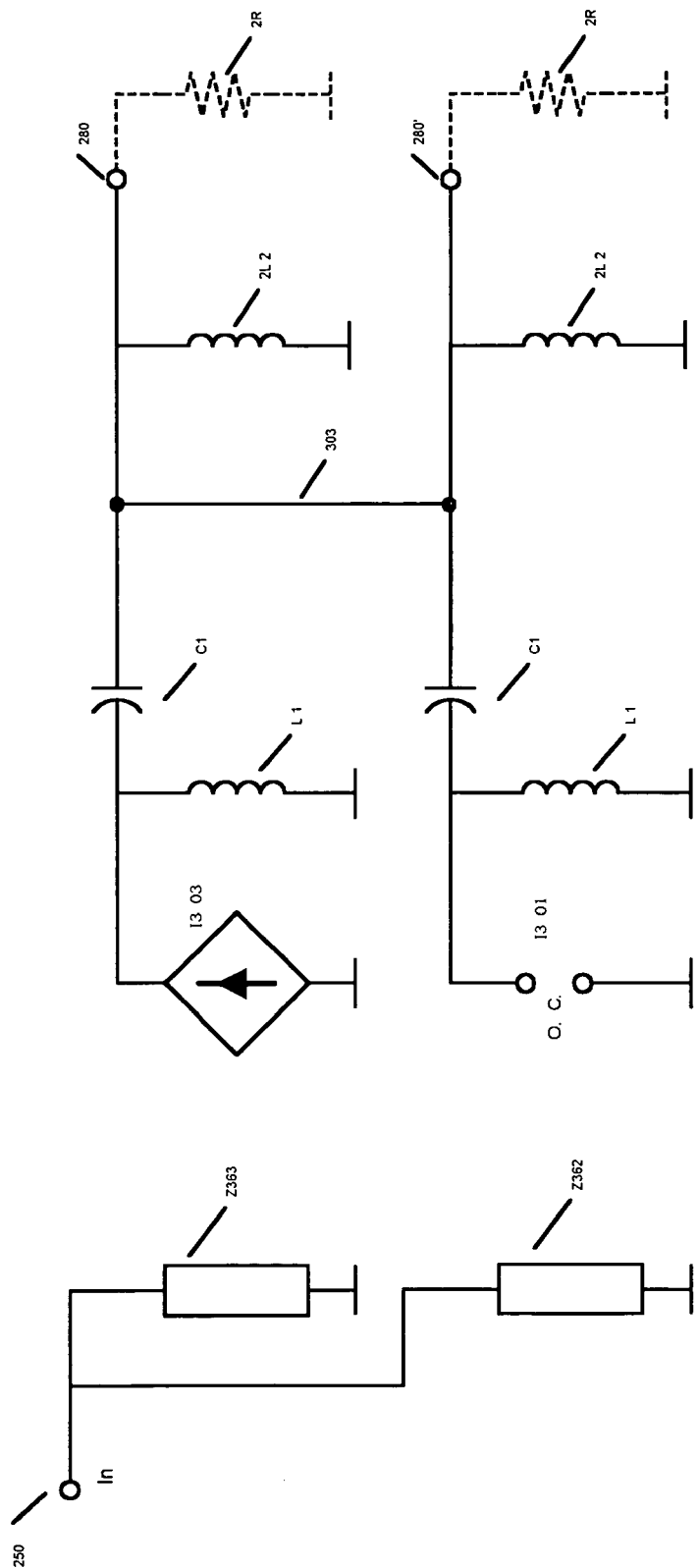
FIG. 4A depicts an alternative small signal equivalent of part of the circuit of FIG. 2 operating in a second mode.

FIG. 4A depicts a small signal equivalent circuit of the RF P A of FIG. 1 when operated in the second mode, i.e. when transistor 201 (FIG. 1) is biased so as to be cut-off Since transistor 201 (FIG. 1) is biased to be cut off the corresponding voltage-dependent current source is represented by open circuit I301 i.e. a current "source" of zero amps.

Comparing and contrasting FIG. 3 with FIG. 4A, it is apparent that the input impedance is substantially the same but the one active voltage-controlled current source I303 will supply current to both load resistances 2R. Significant current may flow in conductor 303. Moreover, the equivalent circuit of FIG. 4A will produce significantly less gain than that of FIG. 3.

Figure 4B:
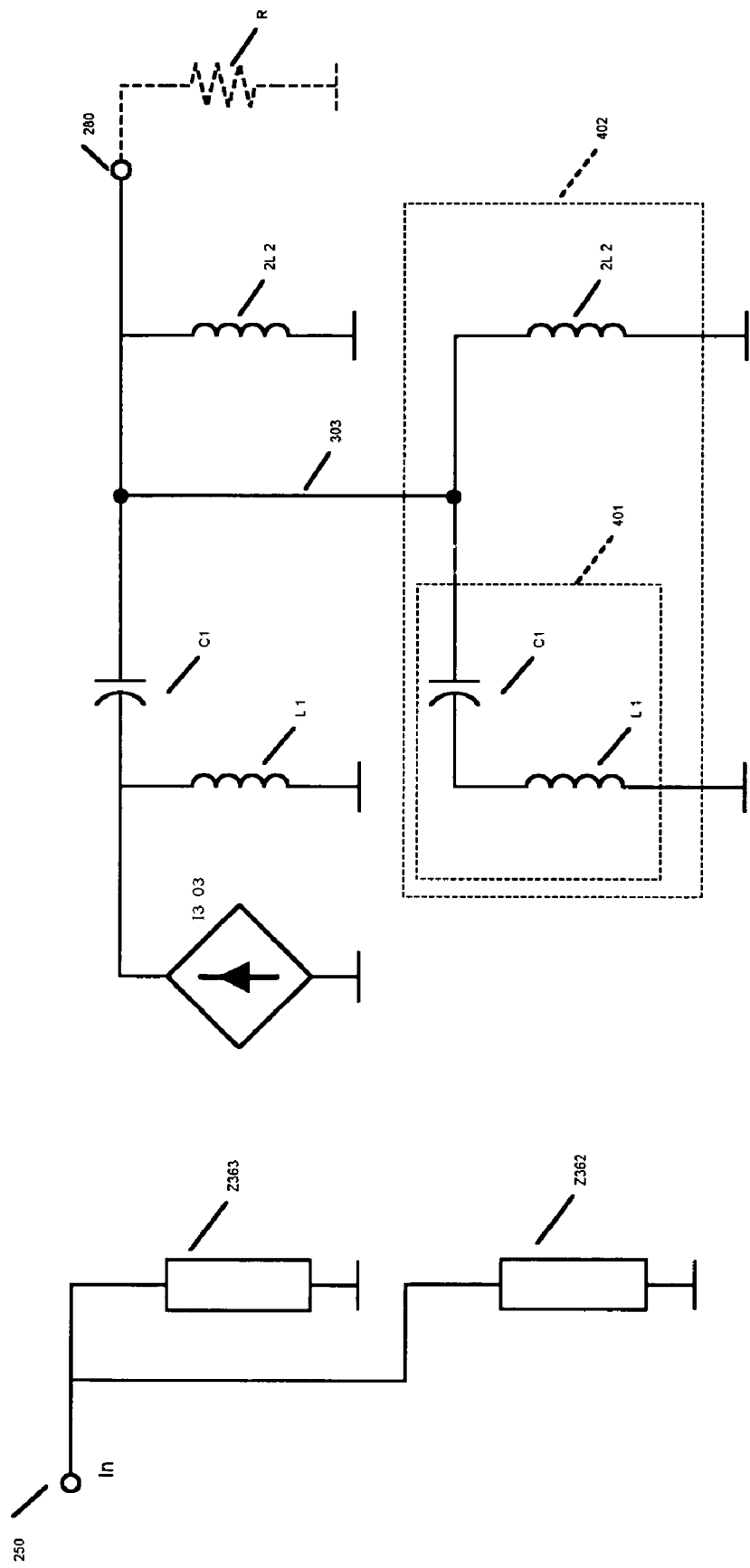
FIGS. 4B and 4C depict other alternative small signal equivalents of part of the circuit of FIG. 2 operating in a second mode.

The equivalent circuit of FIG. 4A may be redrawn as that of FIG. 4B, showing the two load resistances combined as one resistance R (typically about 50 Ohms) and the Open Circuit omitted for clarity.

Considering FIG. 4B, the series circuit leg 401 consisting of C1 in series with L1 can be taken as approximately the same as C1 alone if the circuit is designed such that $\omega_o L1 << 1/\omega_o C1$ . . . where $\omega_o$ is the center operating angular frequency.

The circuit design constraint upon inductance L1 is that of being able to supply a sufficient DC component so that the transistor associated with active voltage-controlled current source I303 can operate with sufficient headroom. The primary design constraint on C1 is that the combination C1 and 2L2 are substantially resonant at the operating frequency. Therefore it is feasible to choose to implement RF PA 200 with a sufficiently large value for C1 and a sufficiently small value for L1 so that this approximation holds. It may be noted that in much of the prior art the value chosen for components fulfilling a similar role to that of L1 are often too large for this approximation to apply to those circuits. C1 must be embodied with a sufficiently small value that the resonant 2L2 has a sufficiently large value to enable it to be embodied reliably and economically. The upper and lower constraints on C1 may both be implemented with available semiconductor technologies. Certain embodiments of the invention may be possible even when the approximation $\omega_o L1 \ll 1/\omega_o C1$ does not hold, provided always that $\omega_o L1 < 1/\omega_o C1$.

Still referring to FIG. 4B, thus, with a judicious choice of circuit values for L1 and C1 then the lower sub-circuit 402 may be approximated as merely consisting of C1 in parallel with 2L2 which, it may be recalled, is by design a resonant combination at the nominal operating frequency. Hence the small signal equivalent circuit may be elegantly simplified to that of FIG. 4C.

Figure 4C:
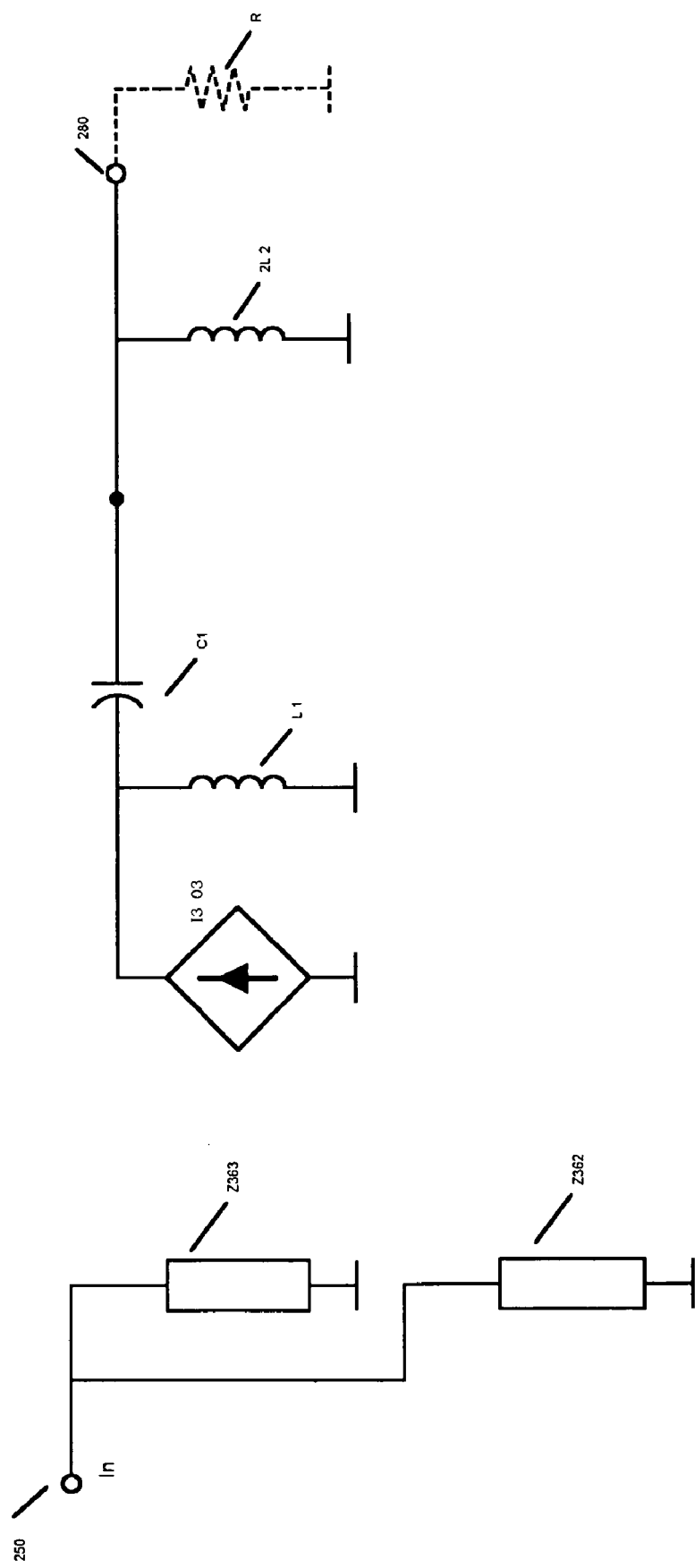

Now we may compare and contrast the small signal equivalent circuits of FIGS. 2, 3 and 4C corresponding to first and second modes of RF PA operation. It may be seen that the operating condition of transistor 202 (FIG. 1) is much the same for either mode. However, only one current source is active in mode 2 and it therefore drives less power into the load without any change in the load itself (still nominally 50 Ohms). Thus, even though the delivered power to the load is lower in the second mode, the power added efficiency, the linearity and/or other electrical performance parameters of the device 202 have not significantly changed or degraded (as compared with operation in the first mode). The term power added efficiency is well known in the RF arts.

Thus, the circuit 200 of FIG. 1 can be designed for an optimal operating point, including good power efficiency of transistors 201 and 202. Importantly, this same good power efficiency is sustained regardless of whether the control voltage present on bias input 261 biases the RF PA 200 to higher-gain with high-power or lower-gain with low-power.

Figure 5B:
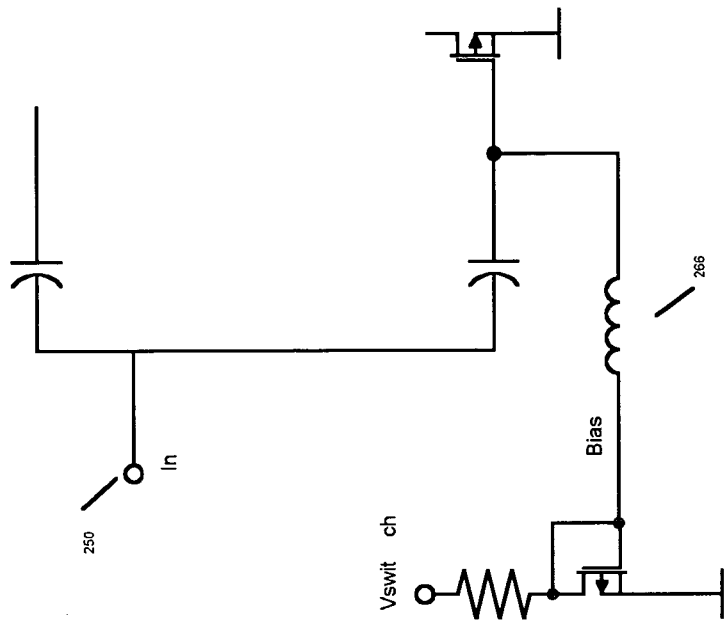
FIGS. 5A and 5B depict alternative embodiments of bias circuits suitable for use with embodiments of the invention.
Figure 5A:
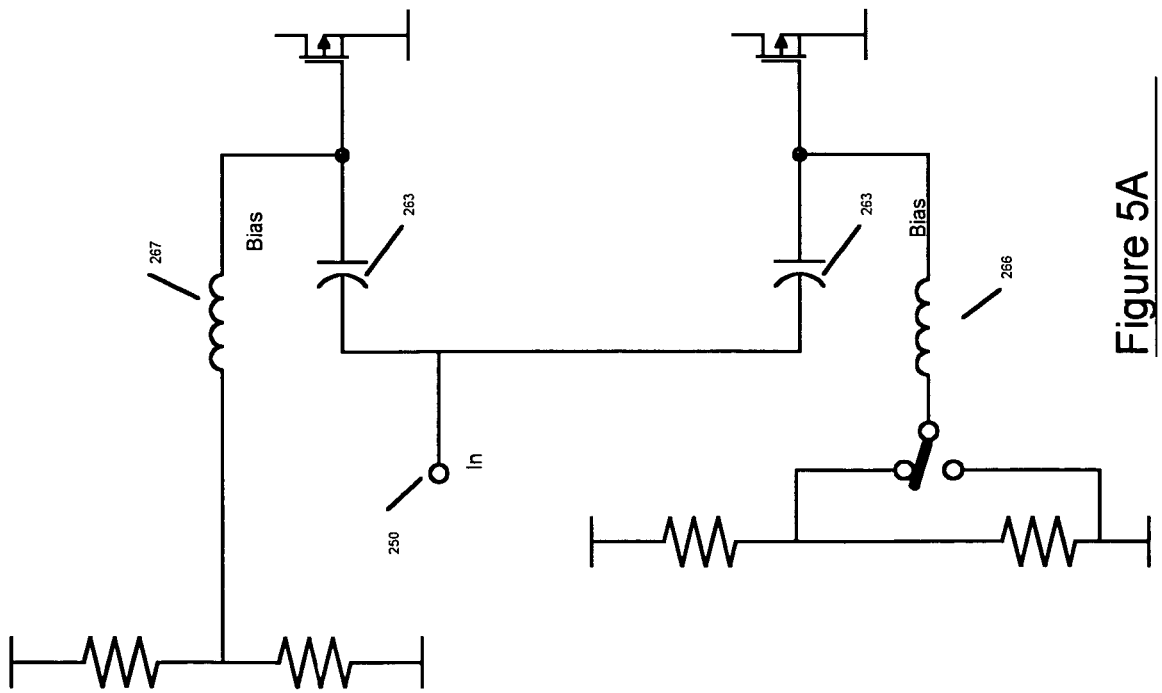

FIGS. 5A and 5B depict alternative embodiments of bias circuits suitable for use with embodiments of the invention, such as IC 200 of FIG. 1. FIG. 5A shows a simple voltage divider arrangement, FIG. 5B sows an approach using a current mirror arrangement such as might be more cheaply embodied in various types of MOS technology.

Actual component values for optimal quantitative compensation may be determined by circuit simulation techniques which are well known in the art. Various suitable circuit simulation software packages are commonplace in the art; for example, HSPICE™ may be used.

Embodiments of the invention as described herein have significant advantages over previously developed implementations.

Figure 6C:
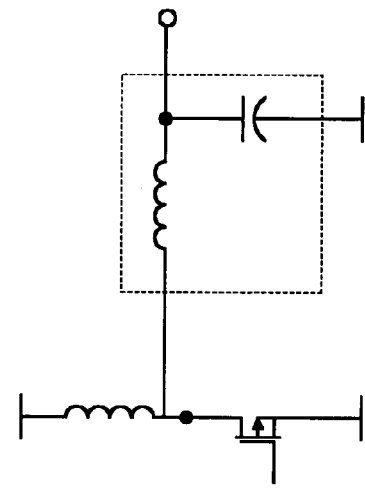
FIGS. 6A, 6B, 6C, 6D show alternatives embodiments of matching network fragments.
Figure 6D:
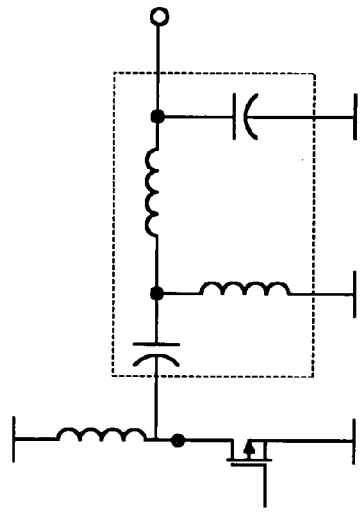
Figure 6A:
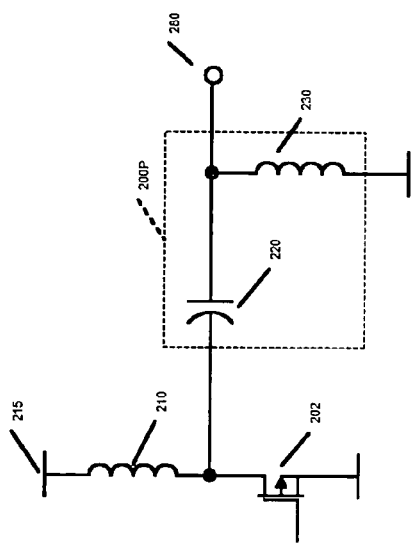
Figure 6B:
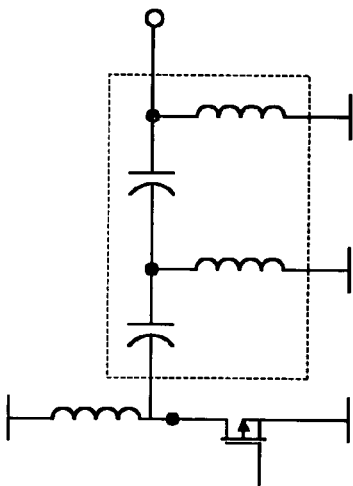

Further embodiments of the invention may be extended to include other circuit configurations, not limited to the resonant high pass "L" match structure of FIG. 1. FIG. 6A shows a relevant fragment from FIG. 1. FIGS. 6B, 6C, 6D show alternatives embodiments including a high-pass "π" match (or alternatively two cascaded high pass L matches), a low-pass "L" match and a bandpass match respectively. As will be apparent to one of ordinary skill in the art, other similar matching circuits are possible with good utility and within the general scope of the invention. Such similar matching circuits may, for example, have higher numbers of stages or even harmonic frequency traps.

And as will be apparent to one of ordinary skill in the art, still further similar circuit arrangements are possible within the general scope of the invention.

For example p-channel devices and n-channel devices may be interchanged with appropriate source-drain and polarity transpositions as is well known in the art. Further examples may include circuits embodied using discrete transistors or as integrated circuits, using metal-oxide semiconductors or other field effect transistors, and/or with Gallium Arsenide transistors or other technologies.

Bipolar junction transistors or even thermionic tubes and other unidentified but active devices could also be used to construct an embodiment of the invention using the appropriate circuit arrangements.

Also it is possible to replace analog circuit components with digital functional equivalents within the general scope of the invention. The embodiments described above are exemplary rather than limiting and the bounds of the invention should be determined from the claims.

Although preferred embodiments of the present invention have been described in detail hereinabove, it should be clearly understood that many variations and/or modifications of the basic inventive concepts herein taught which may appear to those skilled in the present art will still fall within the spirit and scope of the present invention, as defined in the appended claims.

What is claimed is:

1. A method for amplifying comprising:
   operating a first amplifier comprising a first active device supplying a first signal to a first matching network, the first matching network producing a first output, the first matching network including a first set of devices having a first resonance at a normal operating frequency of the circuit; and
   operating a second amplifier comprising a second active device supplying a second signal to a second matching network, the second matching network producing a second output, the second matching network including a second set of devices having a second resonance at the normal operating frequency of the circuit;
   wherein the respective outputs of the first and second amplifiers are summed at a summing node to produce a summed signal and,
   wherein a circuit output signal is derived from the summed signal and,
   wherein the method has at least a first operating mode and a second operating mode and,
   wherein whenever the method is in the first operating mode: the first and second active devices are biased to be active and turned on and,
   wherein whenever the method is in the second operating mode:
   the second active device is biased into at least a partially cutoff condition and the second matching network presents high impedance at the summing node, the high impedance being caused by the second resonance at the normal operating frequency;
   wherein the first matching network is a high-pass "π" match structure;
   whereby the circuit operates with high efficiency and higher power in the first operating mode and the circuit operates with high efficiency and lower power in the second operating mode.

2. A circuit for amplifying comprising:
   a first amplifier comprising a first active device supplying a first signal to a first matching network, the first matching network producing a first output, the first matching network including a first set of devices having a first resonance at a normal operating frequency of the circuit; and a second amplifier comprising a second active device supplying a second signal to a second matching network, the second matching network producing a second output, the second matching network including a second set of devices having a second resonance at the normal operating frequency of the circuit;

wherein the respective outputs of the first and second amplifiers are summed at a summing node to produce a summed signal and, wherein a circuit output signal is derived from the summed signal and, wherein the circuit has at least a first operating mode and a second operating mode and, wherein whenever the circuit is in the first operating mode:

the first and second active devices are biased to be active and turned on and, wherein whenever the circuit is in the second operating mode:

the second active device is biased into at least a partially cutoff condition and the second matching network presents high impedance at the summing node, the high impedance being caused by the second resonance at the normal operating frequency;

wherein the first matching network is a high-pass "π" match structure whereby the circuit operates with high efficiency and higher power in the first operating mode and the circuit operates with high efficiency and lower power in the second operating mode.

* * * * *